(12) United States Patent
Martin

(10) Patent No.: US 6,573,811 B2
(45) Date of Patent: Jun. 3, 2003

(54) RESISTOR TUNING NETWORK AND METHOD FOR MICROELECTRONIC RC-BASED FILTERS

(75) Inventor: Brian C. Martin, Carlsbad, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/778,540

(22) Filed: Feb. 7, 2001

(65) Prior Publication Data

US 2002/0140522 A1 Oct. 3, 2002

(51) Int. Cl.[7] .................................................. H03H 1/02
(52) U.S. Cl. ........................................ 333/172; 333/174
(58) Field of Search ............................... 333/172, 174, 333/24 R, 81 R; 327/553; 341/154

(56) References Cited

U.S. PATENT DOCUMENTS

| | | |
|---|---|---|
| 4,260,968 A | 4/1981 | Haigh et al. |
| 4,302,746 A | 11/1981 | Scarzello et al. |
| 4,323,885 A | 4/1982 | Carriere et al. |
| 4,422,048 A | 12/1983 | Edwards |
| 4,467,286 A | 8/1984 | Stitt |
| 4,791,379 A | 12/1988 | Hughes |
| 4,843,394 A | * 6/1989 | Linz et al. ................... 341/154 |
| 4,864,304 A | 9/1989 | Shigehara et al. |
| 5,043,731 A | 8/1991 | Nishimura |
| 5,455,582 A | 10/1995 | Valdenaire |
| 5,473,278 A | 12/1995 | Shibata |
| 5,592,116 A | 1/1997 | Bedouani |
| 5,841,329 A | * 11/1998 | Dutilleul ..................... 333/175 |

* cited by examiner

*Primary Examiner*—Seungsook Ham
(74) *Attorney, Agent, or Firm*—Davis Munck, P.C.

(57) ABSTRACT

A resistor tuning network for an RC filter has a first, fixed resistor and a second, variable resistance connected in parallel with the fixed resistor. The variable resistance is an R-2R ladder circuit having an input and first and second output terminals, with a first line having a plurality of first arms connected in series with the input and first output terminal and nodes between each pair of arms, each arm having an identical resistor R. A series of shunt arms are selectively connected between the respective nodes and the first or second output terminal. Each shunt arm has a 2R resistor and a switch in series, and each switch has a first, closed position connecting the shunt arm to the first output terminal and a second, open position connecting the shunt arm to the second output terminal, such that the resistance of the ladder network is varied dependent on the switch positions and is at a maximum value when all switches are closed and a minimum value when all switches are open. The overall resistance is tuned by varying the switch positions in the ladder circuit.

10 Claims, 3 Drawing Sheets

RESISTOR TUNING NETWORK AND METHOD FOR MICROELECTRONIC RC-BASED FILTERS

BACKGROUND OF THE INVENTION

The present invention relates generally to tuning of a resistor in an RC filter, and is particularly concerned with tuning of on-chip, microelectronic components.

Filtering is a fundamental signal processing tool used in almost all electronics systems. While some filtering functions can be performed in the digital domain, filtering in analog domain is essential in countless applications where only analog techniques enable high-speed processing of small signal levels with the required resolution. Front-end processing in almost all electronic systems such as wireless and wireline communications, video, audio, imaging, etc. rely heavily on filtering in the analog domain.

We have been witnessing in the last several decades that the cost and footprint of electronic systems are scaling down significantly as increasingly more functionality is integrated on a single chip of semiconductor. While microchip processing is extremely efficient in building large number of devices on a microchip, analog processing still suffers from variations in component values from one fabrication run to another. Further limitations to analog processing accuracy come from the dependence of component parameters on temperature, which is becoming more and more costly to control as a result of large scale integration. A widely recognized solution to this problem is the tuning of on-chip components until the error due to component variations becomes negligible.

In a typical RC filter composed of amplifiers, resistors and capacitors, the accuracy of filter transfer function is determined by the resistor and capacitor values. In general, either resistors or capacitors can be tuned to obtained the required overall transfer function. Tuning can be performed efficiently by switching small-valued components in or out of the circuit. As the dominant non-ideality of a reasonably-sized micro-switch is its parasitic resistance (up to very high frequencies), tuning of capacitors poses a difficulty as a result of an undesired resistance appearing in series with the capacitor to be tuned. Tuning of resistors, therefore, can be more effective in many realizations.

FIG. 1 illustrates a conventional scheme of tuning a resistor via switching in or out some small-valued resistors that are in series with the resistor to be tuned. In this circuit, switches are closed and opened to include more or less resistance $R_x$ in series with the resistance to be tuned ($R_{tune}$). When fine tuning is desired, the switched resistors need to be much smaller than the resistor to be tuned, typically on the order of one hundredth or less. This necessarily requires large size switches, such that the parasitic switch resistance can be neglected next to the tuning resistors. A typical example is a 5 k resistor to be tuned to below 1% precision. This requires less than 50 ohm tuning resistors, which in turn requires a switch resistance on the order of 10 ohms or less. A switch with such a low on resistance requires a transistor that is several hundred times larger than a minimum geometry device. Note that, increased switch size, besides requiring more chip real estate, also exhibits higher parasitic capacitance along the signal path, and increased noise coupling through the substrate. The large spread of resistor values also limits the accuracy and matching between resistors. Small-valued resistors also require much more hand-tailoring in layout, as their aspect ratios turn out to be awkward, and parasitic contact resistances introduce considerable error to overall resistance. Another difficulty is that different tuning resistor values are needed for each different resistor value to be tuned (such that the same relative accuracy can be maintained across all resistors). For example, 50 ohm resistors are needed to tune a 5 k resistance, whereas 75 ohm resistors would be needed to tune 7.5 k resistor with the same relative increments.

SUMMARY OF THE INVENTION

It is an object of the present invention to provide a new and improved filter tuning network which is particularly suitable for tuning microchip integrated resistors.

According to one aspect of the present invention, a resistor tuning network for connection in series with a resistor to be tuned is provided, which comprises a first resistor having a fixed resistance and ladder circuit comprising a resistor ladder network connected in parallel with the first resistor, the ladder circuit having an input and first and second output terminals, a plurality of arms connected in series with the input and first output terminal, each arm having a resistor R and a node separating each pair of adjacent arms, a shunt arm connected to each node, each shunt arm having a resistor which has a value which is a multiple of R and a switch in series, each switch having a first, closed position connecting the shunt arm to the first output terminal and a second, open position connecting the shunt arm to the second output terminal, such that the resistance of the ladder network is varied dependent on the switch positions and is at a maximum value when all switches are closed and a minimum value when all switches are open, whereby a resistance can be tuned by varying the switch positions in the ladder circuit.

This arrangement produces a tuning network which exhibits good linearity in the resistor value with switch positions, allowing fine tuning of a large spread of resistor values. In an exemplary embodiment, a third resistor R3 is connected in series with the tuning network of the first resistor and ladder circuit. The ladder network may be an R-2R ladder. Because the switches in the R-2R ladder are all in series with the same amount of resistance, i.e. 2R, they can be uniformly sized. In an exemplary embodiment, 2R is of the order of at least one kilohm, so that switch sizes can be kept small and switch induced non-linearities can be kept negligible. Thus, this arrangement permits an effective tuning network for an RC filter to be integrated on a single chip.

In an exemplary embodiment of the invention, the equivalent resistance REQ of the ladder network is given by the following relationship:

$$REQ = \frac{1 + R3(R1^{-1} + R2^{-1})}{R1^{-1} + b^{-1}R2^{-1}}$$

where R1 is the first resistance connected in parallel with the R-2R ladder circuit, R2 is the resistance of the R-2R ladder circuit, which is varied according to the number of switches which are closed, R3 is the third resistance, and b represents the current switch positions and is controlled by the function:

$$b = \sum_{i=1}^{n} C_i 2^{-i}$$

Where n is the number of branches in the R-2R ladder.

According to another aspect of the present invention, a method of tuning the resistance of an RC filter in a microchip is provided, which comprises the steps of:

connecting a resistor tuning network including an R-xR ladder in series with a resistor to be tuned which forms part of an RC filter, where xR is a multiple of R; and varying the resistance of the R-xR ladder by selectively opening and closing switches connected in xR branches of the R-xR ladder to connect lesser or greater numbers of the xR branches to an output terminal of the R-xR ladder in order to tune the resistor to be tuned to a desired resistance value.

In an exemplary embodiment, the resistor tuning network is integrated on a microchip on which the RC filter is built. In order to improve linearity of the tuning transfer function with successive switch openings along the ladder, a tuning network comprising the R-xR ladder in parallel with a fixed resistance is connected in series with a third resistor. The R-xR ladder is an R-2R ladder in an exemplary embodiment of the invention.

By connecting a resistance in parallel with an R-2R ladder circuit, a resistor tuning network is provided which has good linearity in its tuning transfer function and allows a large spread of resistor values. With this arrangement, high tuning accuracy is achieved with a small spread in resistor values. Because the switches in the R-2R ladder are all in series with the same amount of resistance (i.e. 2R), they can be uniformly sized. By selecting 2R to be of the order of 1 kohm or more, switch sizes can be made small, enabling the network to be integrated into a microelectronic chip or silicon chip.

BRIEF DESCRIPTION OF THE DRAWINGS

The present invention will be better understood from the following detailed description of an exemplary embodiment of the invention, taken in conjunction with the accompanying drawings in which like reference numerals refer to like parts and in which.

DETAILED DESCRIPTION OF THE DRAWINGS

Figure 1:
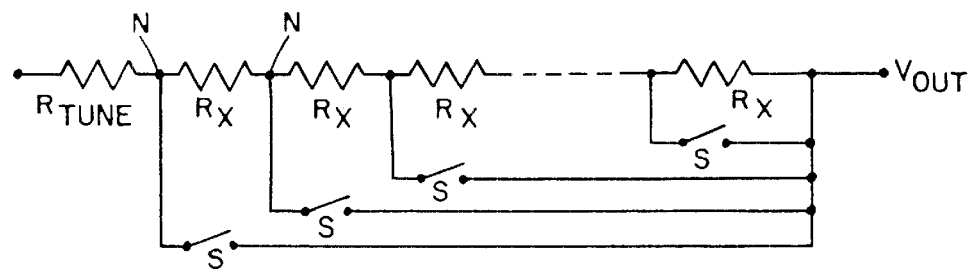
FIG. 1 is a schematic diagram illustrating a prior art resistor tuning network.

As noted above, FIG. 1 of the drawings illustrates a conventional or prior art resistor tuning network in which a plurality of identical resistors Rx are connected in series with a resistor $R_{TUNE}$ to be tuned. A branch line is connected between each node N of the network and the output $V_{OUT}$, with a switch S in each branch line for controlling its connection in the circuit. Switches S are opened or closed to provide more or less resistance in series with the resistance to be tuned. When fine tuning is desired, the switched resistors have to be much smaller than the resistor to be tuned, typically on the order of one hundredth or less. This necessarily requires large size switches so that the parasitic resistance can be neglected next to the tuning resistors Rx. Increased switch size in turn increases the area required for the tuning network, and typically makes it too large for incorporation on a single microelectronic chip.

Figure 2:
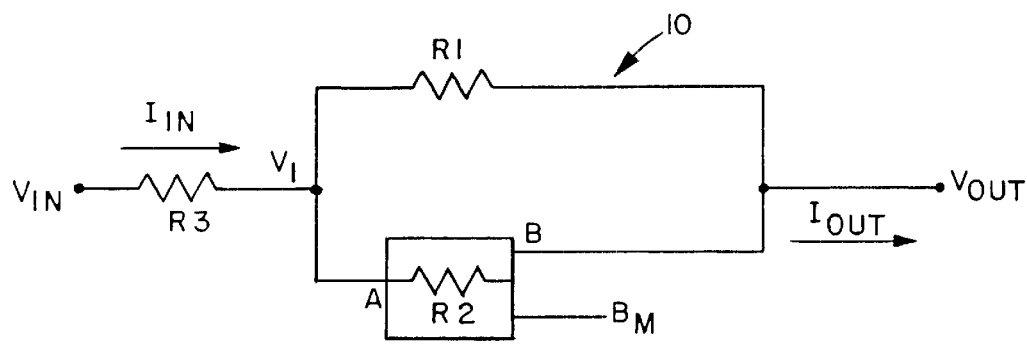
FIG. 2 is a schematic diagram illustrating a resistor tuning network according to an exemplary embodiment of the invention.
Figure 3:
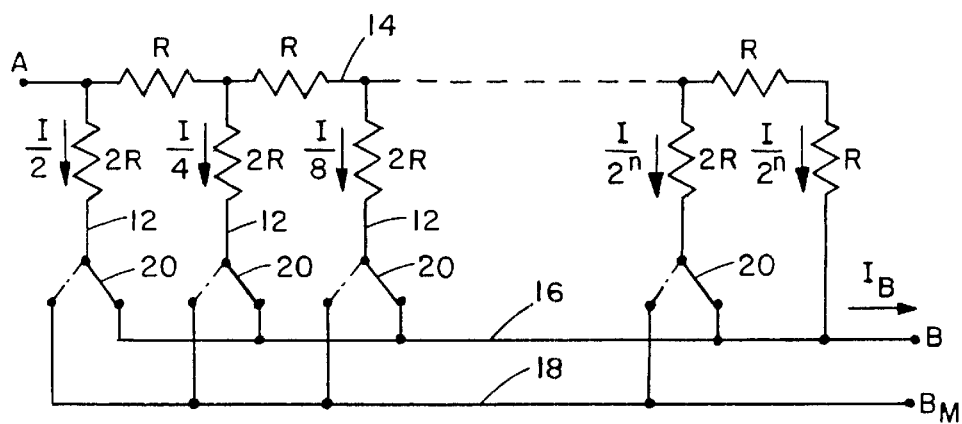
FIG. 3 is a schematic diagram illustrating the R-2R ladder circuit of FIG. 2 in more detail.

FIGS. 2 and 3 illustrate a resistor tuning network according to an exemplary embodiment of the invention in which the components can be of relatively small size suitable for integration on a semiconductor chip for tuning an on-chip resistor, particularly a resistor forming part of an RC filter. As illustrated in FIG. 2, a resistance to be tuned, R3, is connected in series with a tuning network 10 which comprises a first, fixed resistor R1 in parallel with a variable resistor R2. The circuit has an input voltage $V_{IN}$, an input current $I_{IN}$ through resistance R3, and an output voltage $V_{OUT}$ and current $I_{OUT}$. The variable resistor R2 comprises an R-2R ladder, as illustrated in detail in FIG. 3, and has an input terminal A, an output terminal B, and a second output terminal $B_M$.

As best illustrated in FIG. 3, the R-2R ladder R2 has a series of resistors R of constant resistance connected in series between input node A and output node B. A series of branch or shunt lines 12 are connected between input line 14 and either output line 16 which connects to terminal B or output line 18 which connects to terminal $B_M$, dependent on the position of a switch 20 positioned in each line 12. A resistor 2R having a resistance twice that of resistor R is connected in each shunt line 12. In this ladder, the output current at node B, or $I_B$, is given by:

$$I_B = \frac{V_A}{R} \cdot b \qquad (1)$$

where b is a parameter representing the switch positions, given by $$b = \sum_{i=1}^{n} C_i 2^{-i} \qquad (2)$$

where n is the total number of branch lines or switches, $V_A$ is the voltage at node A, and C is a constant. Equation ① assumes that the voltages at terminals B and $B_M$ are at ground relative to the voltage $V_A$.

Figure 4:
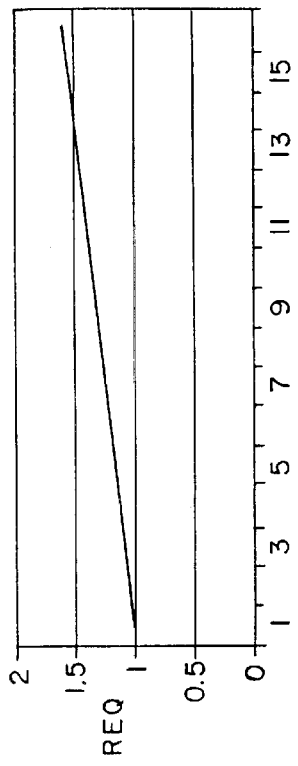
FIG. 4 illustrates the variation of the equivalent resistor value of a resistor tuning network consisting of only the R-2R ladder circuit of FIG. 3 with the number of switches closed.

The ladder exhibits constant resistance R with respect to the input terminal A, but the currents coming out of terminals B and $B_M$ depend on the position of the switches. When all switches are closed, as illustrated in solid line in FIG. 3, total current of the ladder is observed at the B terminal. As the switches are opened, into the dotted line position, currents (in vertical branches 12 of the ladder) are stolen from the B terminal and delivered to the $B_M$ terminal. Note that, for proper operation, the B and $B_M$ points of the ladder must be at the same potential, a requirement that can be easily satisfied in many configurations. Tuning of the overall resistance of the network shown in FIG. 2 can therefore be realized by controlling the switches of the R-2R ladder. FIG. 4 illustrates the transfer function of the ladder of FIG. 3, where the equivalent resistance of the ladder between the A and B terminals is plotted as a function of a parameter b representing the switch positions: when all switches are closed, b=1. On the other hand, when all switches are open, b=$2^n$(because now, only the right most branch's current is available to terminal B). The letter n represents the binary depth of the ladder, which is equal to the number of vertical branches, and also to the number of switches in the ladder. The minimum and maximum resistances that can be obtained from the ladder are equal to R and $2^n$R respectively (graph only shows the transfer function at small b values).

Figure 5:
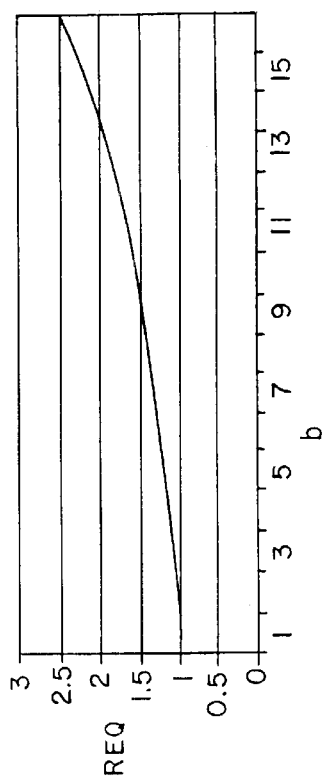
FIG. 5 is similar to FIG. 4, but illustrates the more linear tuning function achieved by connecting the R-2R ladder circuit in parallel with a fixed resistance, as in FIG. 2.

For fine tuning of resistors at different values, the non-linearity of this transfer curve poses severe difficulties. Tuning accuracy with respect to minimum switch steps becomes smaller and smaller as the equivalent resistor value increases. The linearity of the curve can be improved significantly by adding a resistance in parallel with the R-2R ladder. This is the purpose of R1 in FIG. 2. FIG. 5 shows the transfer curve for network 10, illustrated the much improved linearity.

The transfer function of the network 10 (FIGS. 2 and 3) is derived below. For simplicity, we assume that $V_{OUT}$ is at virtual ground, i.e. $V_{OUT}$=0.

$$I_{IN} = \frac{V_{IN} - V_1}{R3}$$

$$I_{IN} = \frac{V_1}{R1} + \frac{V_1}{R2}$$

$$I_{OUT} = \frac{V_1}{R1} + \frac{V_1}{b\,R2}$$

Eliminating $V_1$ and $I_{IN}$ in the above equations yields for the equivalent resistance of network 10:

$$\frac{V_{IN}}{I_{OUT}} = REQ = \frac{1 + R3(R1^{-1} + R2^{-1})}{R1^{-1} + b^{-1}R2^{-1}} \quad (3)$$

Choosing some example values for R1 and R2, (for example R1=R2=2 kohm), the above equation results in:

$$REQ = \frac{2(1+R3)}{1+b^{-1}} \quad (4)$$

where b is the switch parameter that varies between 1 and $2^n$ with unit increments. For fine tuning, large values of b are used.

EXAMPLE

Figure 6A:
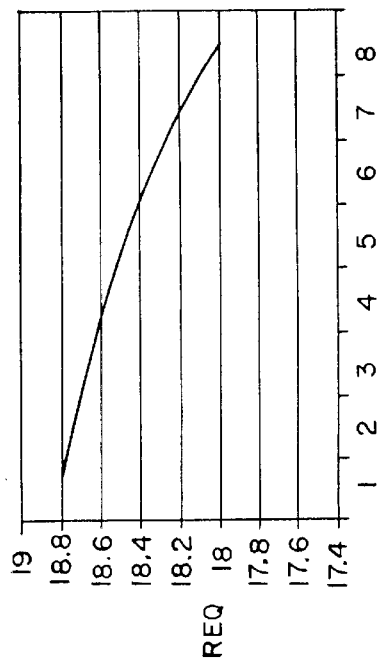
FIG. 6A illustrates a first example of tuning of the equivalent resistor value variation of the tuning network when tuning a 9.1 kohm resistor.
Figure 6B:
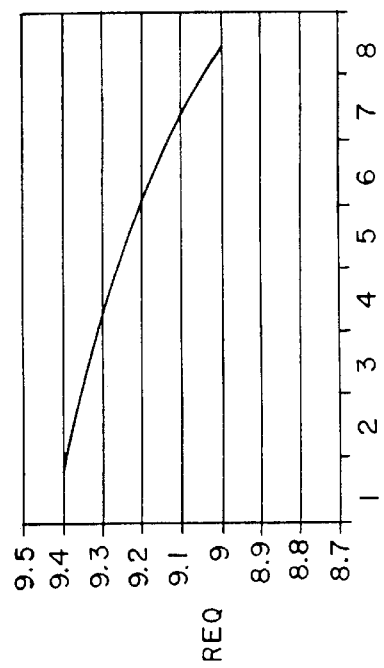
FIG. 6B illustrates a second example of tuning of the equivalent resistor value variation of the turning network when tuning an 18.8 kohm resistor.

Assume that two resistors need to be tuned to 9.1 kohm and a 18.8 kohm respectively. R1 and R2 can be set to 2 kohm. This allows all the resistors to be built out of unit resistors. Switches in the ladder are in series with 4 kohm resistors, and can therefore be very small. For a 9.1 k resistor, R3 is chosen to be 4 kohm, and for an 18.8 k resistor, R3 is chosen to be 9 kohm. n is chosen to be 4. FIGS. 5, 6A, and 6B show the equivalent resistance of the two resistors as a function of tuning. It is observed that in this case of a 9.1 kohm resistor (FIG. 6A), the tuning step size is approximately 40 ohm, whereas in the 18.8 k resistor case, the step size is 80 ohms. Therefore, both resistors are tuned with 0.4% step size even though the same R-2R ladder is used in each resistor's network, and the switches are controlled the same exact way.

The resistor tuning network of this invention has many advantages over prior art tuning schemes in which a series of small value resistors are simply switched into or out of the series with the resistor to be tuned. First, because the switches are each in series with the same amount of resistance, e.g. 2R, they can be uniformly sized. By selecting 2R to be of the order of 1 kohm or more, the switch sizes can be kept small, allowing the overall network to be kept small enough such that it can be readily integrated in a microchip. The desired resistance is obtained, essentially, by the denominator of Equation (4) above, controlled solely by R3, producing a nice gain term which increases the effective resistance in small increments. Once R3 is calculated for a given resistor implementation, there is no need to calculate tuning resistor values. This arrangement allows resistor R3 to be selected depending on the overall range required for the equivalent resistance REQ, while control of R2 allows the fine tuning of REQ. Although the resistor ladder network described above is an R-2R ladder, other ladder networks having branch resistors which are different multiples of R may alternatively be used. For optimum results, the resistance in each branch should be the same, so that the switches can be uniformly sized.

By providing a fixed resistor R1 in parallel with an R-2R ladder circuit, the tuning transfer function can be made more linear, allowing fine tuning of a large spread of resistor values with the same basic circuit. High tuning accuracy is achieved with a small spread in resistor values. If desired, all resistors in the network, including the ones in the R-2R ladder, can be built out of the same unitary resistors. This simplifies circuit design and improves tracking and matching properties of microchip resistors.

Figure 7:
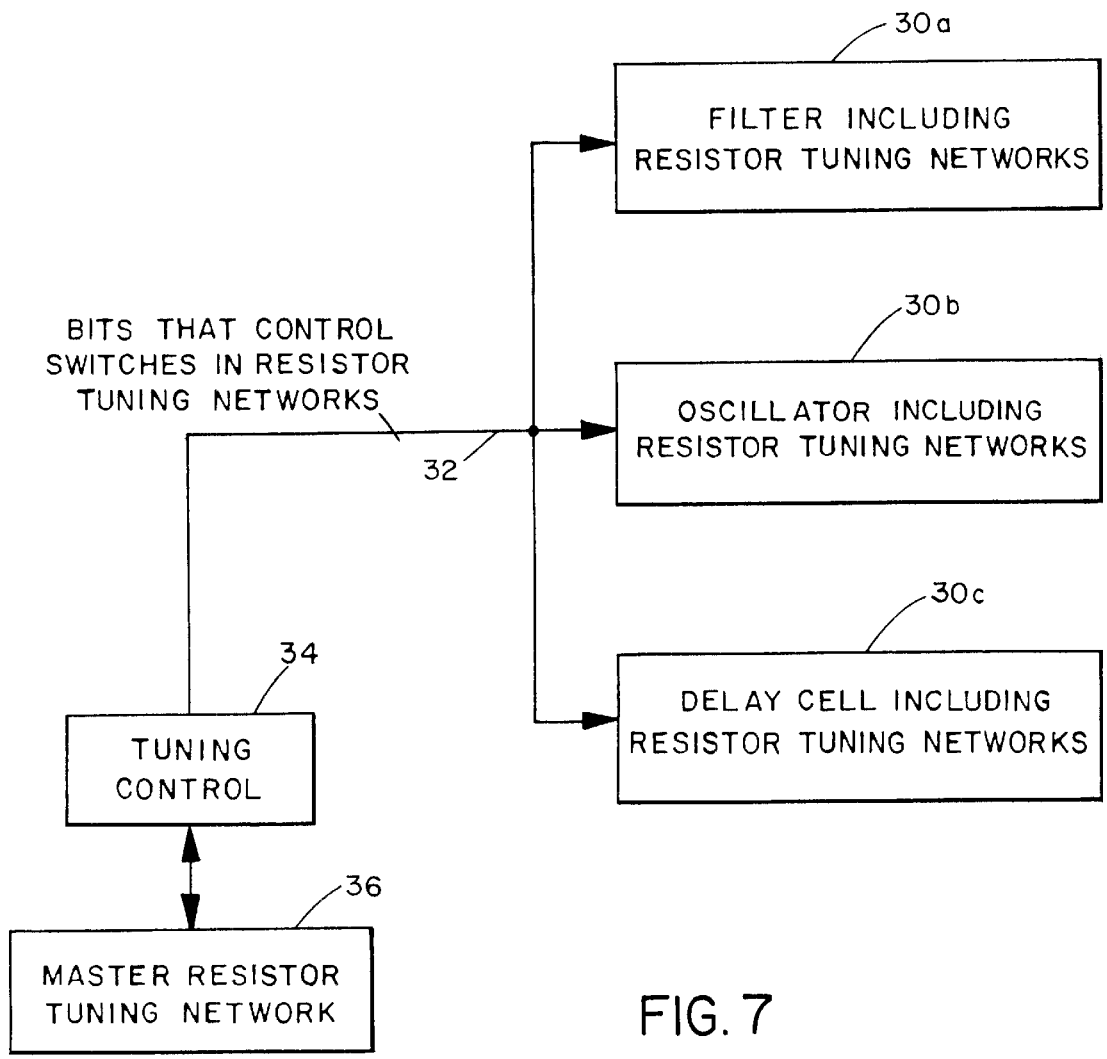
FIG. 7 is a schematic tuning block diagram illustrating tuning of different IC component blocks using a common control block.

In this arrangement, all resistors to be tuned can use the same R-2R network, with the same resistor values and switch sizes. If the same control lines are used for the R-2R ladders of all the resistors, the resistors can be tuned by the same relative amount with respect to their nominal values, as illustrated schematically in FIG. 7. A plurality of different component blocks 30a, 30b, 30c, etc. within an IC each use the resistor tuning network of FIGS. 2 and 3. Each tuning network is tuned via a common control line 32 from a tuning control unit 34, with signal bits controlling the switches in the resister tuning network. The tuning control unit 34 determines the tuning control bits by observing the behavior of a master resistor tuning network 36. This is a strong layout advantage compared to the standard scheme where any different valued resistor to be tuned requires its own set of tuning resistor values and switch sizes.

Although an exemplary embodiment of the invention has been described above by way of example only, it will be understood by those skilled in the field that modifications may be made to the disclosed embodiment without departing from the scope of the invention, which is defined by the appended claims.

I claim:

1. A resistor tuning network for connection in series with a resistor to be tuned, comprising:

a first resistor having a fixed resistance, an input for connection to a resistor to be tuned, and an output; and a resistor ladder network connected between the input and output in parallel with the first resistor, the ladder network having an input and first and second output terminals, the first output terminal being connected to said output;

the ladder network having a first line comprising a plurality of first arms connected in series with the input and first output terminal and nodes between each pair of arms, each arm having an identical resistor R, a second line connected to said first output terminal, and a third line connected to said second output terminal;

a series of shunt arms, each shunt arm having a first end connected to a respective node and a second end, a resistor which has a value which is a multiple of R and a switch in series between the first and second end of each shunt arm, each switch having a first, closed position connecting the shunt arm to the second line and a second, open position connecting the shunt arm to the third line, such that the resistance of the ladder network is varied dependent on the switch positions and is at a maximum value when all switches are closed and a minimum value when all switches are open, whereby a resistance can be tuned by varying the switch positions in the ladder circuit; and wherein said resistor to be tuned is a third resistor R3 connected in series with the parallel connected first resistor and ladder network.

2. The network as claimed in claim 1, wherein the resistor ladder network is an R-2R ladder.

3. The network as claimed in claim 2, wherein the resistance 2R is at least 1 kohm.

4. The network as claimed in claim 1, wherein the ladder network is an R-2R ladder, and the tuning network has an equivalent resistance REQ given by the following relationship:

$$REQ = \frac{1 + R3(R1^{-1} + R2^{-1})}{R1^{-1} + b^{-1}R2^{-1}}$$

where R1 is the first resistance connected in parallel with the R-2R ladder circuit, R2 is the resistance of the R-2R ladder, R3 is the third resistance to be tuned connected in series with the tuning network, and b represents a current switch position $$b = \sum_{i=1}^{n} C_i 2^{-i}$$

that varies between 1 and $2^n$ with unit increments where n is the total number of shunt arms.

5. A method of tuning the resistance of an RC filter, comprising the steps of:

connecting a resistor ladder network comprising an R-xR ladder, where xR is a multiple of R, in parallel with a first fixed resistor to form a resistor tuning network;

varying the resistance of the of the R-xR ladder by selectively opening and closing switches connected in xR branches of the R-xR ladder to connect lesser or greater numbers of the xR branches to an output terminal of the R-xR ladder in order to tune a third resistor to be tuned to a desired resistance value; and connecting the tuning network in series with the third resistor to be tuned.

6. The method as claimed in claim 5, wherein the resistor tuning network is integrated on a microchip on which the RC filter is built.

7. The method as claimed in claim 5, including the steps of connecting a plurality of identical resistor tuning networks in series with a plurality of different-valued resistors to be tuned.

8. The method as claimed in claims 5, wherein the ladder network is an R-2R ladder.

9. The method as claimed in claim 8, wherein the tuning network has an equivalent resistance REQ given by the following relationship:

$$REQ = \frac{1 + R3(R1^{-1} + R2^{-1})}{R1^{-1} + b^{-1}R2^{-1}}$$

where R1 is the first resistance connected in parallel with the R-2R ladder circuit, R2 is the resistance of the R-2R ladder, R3 is the third resistance to be tuned connected in series with the tuning network, and b represents a current switch position that varies between 1 and $2^n$ with unit increments where n is the total number of shunt arms.

10. The method as claimed in claim 8, wherein the resistance 2R is it least 1 kohm.

* * * * *

UNITED STATES PATENT AND TRADEMARK OFFICE
CERTIFICATE OF CORRECTION

PATENT NO.   : 6,573,811 B2
DATED        : June 3, 2003
INVENTOR(S)  : Brian C. Martin It is certified that error appears in the above-identified patent and that said Letters Patent is hereby corrected as shown below:

Column 5,
Line 51, delete "a" after "and";
Lines 54 and 55, delete "k" and replace with -- kohm --;
Line 56, insert -- The value -- before "n" and delete "4" and replace with -- four (4) --;
Line 60, delete "40 ohm" and replace with -- fourty (40) ohms -- and insert -- case of the -- before "18.8" and delete "k" and replace with -- kohm --;
Line 61, delete "case";
Line 62, insert -- a -- before "0.4%";

Column 8,
Line 5, delete "of the" after "resistance".

Signed and Sealed this

Twenty-first Day of February, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,573,811 B2 |
| APPLICATION NO. | : 09/778540 |
| DATED | : June 3, 2003 |
| INVENTOR(S) | : Brian C. Martin |

It is certified that error appears in the above-identified patent and that said Letters Patent is hereby corrected as shown below:

Column 5, line 60, delete "(40) ohms" and replace with --forty (40) ohms--.

Signed and Sealed this

Seventh Day of November, 2006

JON W. DUDAS
*Director of the United States Patent and Trademark Office*